United States Patent
Hong et al.

(10) Patent No.: US 8,004,906 B2
(45) Date of Patent: Aug. 23, 2011

(54) NONVOLATILE MEMORY DEVICE AND METHOD OF OPERATING AND FABRICATING THE SAME

(75) Inventors: Ki-ha Hong, Yongin-si (KR);
Sung-hoon Lee, Yongin-si (KR);
Jae-woong Hyun, Yongin-si (KR);
Jai-kwang Shin, Yongin-si (KR);
Young-gu Jin, Yongin-si (KR); Sung-il Park, Yongin-si (KR); Jong-seob Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/805,498

(22) Filed: Aug. 3, 2010

(65) Prior Publication Data

US 2010/0302870 A1    Dec. 2, 2010

Related U.S. Application Data

(63) Continuation of application No. 12/010,706, filed on Jan. 29, 2008, now Pat. No. 7,813,185.

(30) Foreign Application Priority Data

Jun. 14, 2007    (KR) .................. 10-2007-0058573

(51) Int. Cl.
*G11C 16/04*    (2006.01)

(52) U.S. Cl. ......... 365/185.29; 365/185.33; 365/185.11; 365/185.22

(58) Field of Classification Search ............. 365/185.29, 365/185.33, 185.11, 185.22
See application file for complete search history.

(56) References Cited

U.S. PATENT DOCUMENTS

| | | | |
|---|---|---|---|
| 6,392,933 B1 * | 5/2002 | Yoshida | .................. 365/185.29 |
| 6,894,924 B2 | 5/2005 | Choi et al. | |
| 6,903,981 B2 | 6/2005 | Futatsuyama et al. | |
| 6,967,874 B2 | 11/2005 | Hosono | |
| 6,975,543 B2 | 12/2005 | Kurihara | |
| 7,035,147 B2 | 4/2006 | Yeh et al. | |
| 7,369,436 B2 * | 5/2008 | Forbes | ..................... 365/185.17 |
| 2006/0249779 A1 | 11/2006 | Choi et al. | |

* cited by examiner

*Primary Examiner* — Connie C Yoha
(74) *Attorney, Agent, or Firm* — Harness, Dickey & Pierce, P.L.C.

(57) ABSTRACT

Provided is a method of reliably operating a highly integratable nonvolatile memory device. The nonvolatile memory device may include a string selection transistor, a plurality of memory transistors, and a ground selection transistor between a bit line and a common source line. In the nonvolatile memory device, data may be erased from the memory transistors by applying an erasing voltage to the bit line or the common source line.

23 Claims, 7 Drawing Sheets
(3 of 7 Drawing Sheet(s) Filed in Color)

NONVOLATILE MEMORY DEVICE AND METHOD OF OPERATING AND FABRICATING THE SAME

PRIORITY STATEMENT

This application claims priority under 35 U.S.C. §119 to Korean Patent Application No. 10-2007-0058573, filed on Jun. 14, 2007, in the Korean Intellectual Property Office, the disclosure of which is incorporated herein in its entirety by reference. This is a continuation of U.S. application Ser. No. 12/010,706 filed Jan. 29, 2008 now U.S. Pat. No. 7,813,185; the contents of which are hereby incorporated by reference in their entirety.

BACKGROUND

Nonvolatile memory devices, e.g., electronically erasable programmable read only memories (EEPROMs) or flash memories may store data even when power is turned off, and further, stored data may be erased therefrom and new data may be programmed thereto. Nonvolatile memory devices may be used in semiconductor products, e.g., storage media for mobile devices or portable memory sticks, etc.

Recently, with the trend toward smaller semiconductor products, nonvolatile memory devices used in the semiconductor products have become more highly integrated. For example, three-dimensional nonvolatile memory devices may have a higher degree of integration in a plane compared to two-dimensional nonvolatile memory devices. Further, three-dimensional nonvolatile memory devices may be manufactured using silicon-on-insulator (SOI) substrates or nanowire structures.

In three-dimensional nonvolatile memory devices, a channel layer may not be directly connected to a substrate. Thus, in three-dimensional nonvolatile memory devices, it may be more difficult to erase data by applying a body bias to a substrate, unlike in conventional two-dimensional nonvolatile memory devices. In this regard, data may be erased by applying a negative voltage to a control gate electrode. However, this may lower the reliability of a tunneling insulating layer.

SUMMARY

Example embodiments provide a method of more reliably operating a more highly integratable nonvolatile memory device.

According to example embodiments, there is provided a method of operating a nonvolatile memory device. The nonvolatile memory device may include a string selection transistor, a plurality of memory transistors, and/or a ground selection transistor between a bit line and a common source line. In the nonvolatile memory device, data may be erased from the memory transistors by applying an erasing voltage to a bit line and/or a common source line.

According to example embodiments, in the erasing of data, a first erasing voltage may be applied to the bit line and a second erasing voltage may be applied to the common source line. The first erasing voltage may be supplied from a high voltage pump via a row decoder and the second erasing voltage may be supplied from the high voltage pump via a column decoder.

According to example embodiments, in the erasing of data, a pass voltage may be applied to a gate of a string selection transistor and/or a gate of a ground selection transistor.

According to example embodiments, the nonvolatile memory device may further include an auxiliary transistor between the string selection transistor and the bit line and/or between the ground selection transistor and the common source line, and in the erasing of data, a fourth pass voltage may be further applied to the auxiliary transistor.

According to example embodiments, there may be provided a method of operating a nonvolatile memory device including a NAND cell array between a plurality of bit lines and a common source line, the method including simultaneously erasing data from the NAND cell array by applying an erasing voltage to the plurality of bit lines and/or the common source line.

According to example embodiments, a nonvolatile memory device may include a plurality of memory transistors, a bit line, and/or a common source line. The plurality of memory transistors may be between the bit line and the common source line. An erasing voltage may be applied to at least one of the bit line and the common source line to erase data from the plurality of memory transistors. A string selection transistor and/or a ground selection transistor may also be included between the bit line and/or the common source line.

According to example embodiments, a method of fabricating a nonvolatile memory device may include forming a semiconductor layer, the semiconductor layer including channel regions and source and drain regions, forming a plurality of control gate electrodes in or on the channel regions; and/or interposing between the channel regions and the control gate electrodes at least one of tunneling insulating layers, charge storage layers and blocking insulating layers.

BRIEF DESCRIPTION

The patent or application file contains at least one drawing executed in color. Copies of this patent or patent application publication with color drawing will be provided by the Office upon request and payment of the necessary fee.

The above and other features and advantages will become more apparent by describing in detail example embodiments thereof with reference to the attached drawings in which.

DETAILED DESCRIPTION

Example embodiments will now be described more fully with reference to the accompanying drawings, in which example embodiments are shown. Example embodiments may, however, be embodied in many different forms and should not be construed as being limited to the example embodiments set forth herein. Rather, example embodiments are provided so that this disclosure will be thorough and complete, and will fully convey the scope of the invention to one of ordinary skill in the art. In the drawings, the sizes of constitutional elements may be exaggerated for the convenience of illustration.

In example embodiments, rows and columns may be relatively designated according to a viewing direction. Thus, rows and columns may be interchanged.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Now, in order to more specifically describe example embodiments, various embodiments will be described in detail with reference to the attached drawings. However, the present invention is not limited to example embodiments, but may be embodied in various forms. In the figures, if a layer is formed on another layer or a substrate, it means that the layer is directly formed on another layer or a substrate, or that a third layer is interposed therebetween. In the following description, the same reference numerals denote the same elements.

Figure 1:
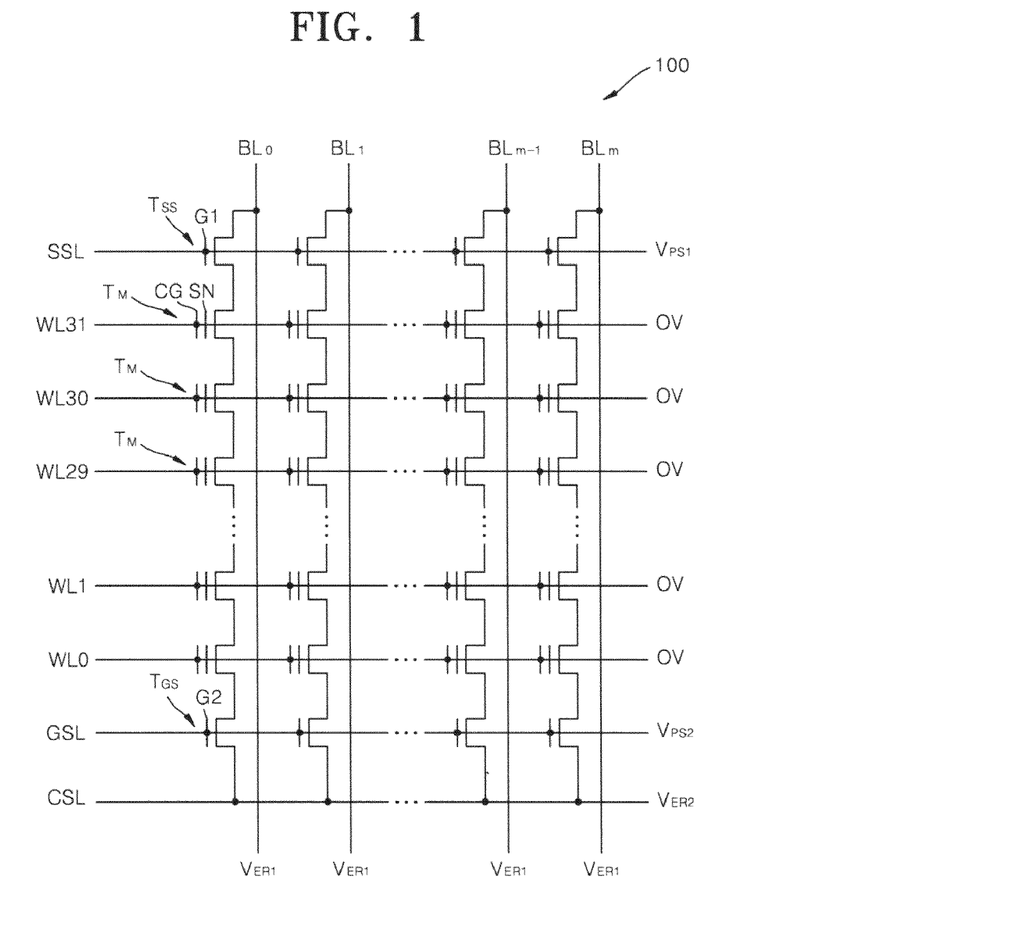
FIG. 1 is a circuit diagram illustrating a layout of a nonvolatile memory device according to example embodiments.

FIG. 1 is a circuit diagram illustrating a layout of a nonvolatile memory device 100 according to example embodiments.

Referring to FIG. 1, the nonvolatile memory device 100 may have a NAND cell array. In the NAND cell array, a plurality of bit lines $BL_0$, $BL_1$ ... $BL_{m-1}$, $BL_m$ may be arranged in columns, and a common source line CSL may be arranged in a row direction. A string selection transistor $T_{SS}$, a plurality of memory transistors $T_M$, and a ground selection transistor $T_{GS}$ may be serially arranged between each of the bit lines $BL_0$, $BL_1$ ... $BL_{m-1}$, $BL_m$, and the common source line CSL.

A string selection line SSL may extend in a row direction so that the string selection line SSL is connected to first gates G1 of string selection transistors $T_{SS}$. A ground selection line GSL may extend in a row direction so that the ground selection line GSL is connected to second gates G2 of ground selection transistors $T_{GS}$. A plurality of word lines WL0, WL1 ... WL29, WL30, WL31 may extend in rows so that they are connected to control gates CG of the memory transistors $T_M$. The number of the memory transistors $T_M$ and the word lines WL0, WL1 ... WL29, WL30, WL31 may vary and does not limit the scope of example embodiments.

Storage nodes SN of the memory transistors TM may store data. For example, data may be programmed into the memory transistors TM by storing charges in the storage nodes SN through charge tunneling. For a data programming operation and a data reading operation, reference may be made to a method of operating a conventional flash memory device. Hereinafter, a method of erasing data programmed in the memory transistors $T_M$ will be described.

In order to erase data from the memory transistors $T_M$, a first erasing voltage $V_{ER1}$ may be applied to the bit lines $BL_0$, $BL_1$ ... $BL_{m-1}$, $BL_m$, and a second erasing voltage $V_{ER2}$ may be applied to the common source line CSL. Furthermore, a first pass voltage $V_{PS1}$ may be applied to the string selection line SSL, and/or a second pass voltage $V_{PS2}$ may be applied to the ground selection line GSL. That is, the first pass voltage $V_{PS1}$ may be applied to the first gates G1, and the second pass voltage $V_{PS2}$ may be applied to the second gates G2.

The first erasing voltage $V_{ER1}$ and the second erasing voltage $V_{vER2}$ may be sufficiently high voltages such that band-to-band tunneling is induced between the memory transistors $T_M$. The band-to-band tunneling may be induced by junction breakdown generated between sources and drains of the memory transistors $T_M$. For example, the first erasing voltage $V_{ER1}$ and the second erasing voltage $V_{ER2}$ may be the same, e.g., 10 to 20 volts (V), for example 15V to 20V.

A channel width of the string selection transistor $T_{SS}$ and the ground selection transistor $T_{GS}$ may be greater than that of the memory transistors $T_M$. In example embodiments, the first erasing voltage $V_{ER1}$ and the second erasing voltage $V_{ER2}$ may be sufficiently high. If not, band-to-band tunneling may not occur in channels of the string selection transistor $T_{SS}$ and the ground selection transistor $T_{GS}$. Thus, the first pass voltage $V_{PS1}$ and the second pass voltage $V_{PS2}$ may be selected so that the string selection transistor $T_{SS}$ and the ground selection transistor $T_{GS}$ are turned on.

For example, the first pass voltage $V_{PS1}$ and the second pass voltage $V_{PS2}$ may be the same as or greater than the first erasing voltage $V_{ER1}$ and the second erasing voltage $V_{ER2}$. In example embodiments, the first pass voltage $V_{PS2}$ may be greater than or the same as the sum of the first erasing voltage $V_{ER1}$ and the threshold voltage of the string selection transistor $T_{SS}$. Similarly, the second pass voltage $V_{PS2}$ may be greater than or the same as the sum of the second erasing voltage $V_{ER2}$ and the threshold voltage of the ground selection transistor $T_{GS}$.

After a predetermined or desired time period, holes may be injected into channels of the memory transistors $T_M$ through band-to-band tunneling. Thus, the channels of the memory transistors $T_M$ may be charged with a balance voltage between the first erasing voltage $V_{ER1}$ and the second erasing voltage $V_{ER2}$. For example, when the first erasing voltage $V_{ER1}$ is the same as the second erasing voltage $V_{ER2}$, the channels of the memory transistors $T_M$ may have an isoelectric potential.

Zero voltage may be applied to the word lines WL0, WL1 . . . WL29, WL30, WL31. Thus, 0 V may be applied to the control gates CG of the memory transistors $T_M$. Therefore, a high electric field may be induced between the channels and the control gates CG of the memory transistors $T_M$, and electrons of the storage nodes SN may be moved to the channels through tunneling. That is, data may be simultaneously erased from the memory transistors $T_M$. Meanwhile, band-to-band tunneling between the channels may also be facilitated by applying a lower voltage than the first erasing voltage $V_{ER1}$ and the second erasing voltage $V_{ER2}$ to the word lines WL0, WL1 . . . WL29, WL30, WL31.

According to example embodiments, a data erasing operation may be performed even without applying a high voltage to the control gates CG. Thus, during a programming operation and an erasing operation, application of high voltages of opposite polarities to the control gates CG may be avoided, thereby enhancing the reliability of the memory transistors $T_M$.

Example embodiments may be modified so that the first erasing voltage $V_{ER1}$ may be applied to some of the bit lines $BL_0, BL_1 \ldots BL_{m-1}, BL_m$, and 0 V may be applied to some of the word lines WL0, WL1 . . . WL29, WL30, WL31. By doing so, data may be selectively erased from only some of the memory transistors $T_M$.

Example embodiments may also be modified so that only one of the first erasing voltage $V_{ER1}$ and the second erasing voltage $V_{ER2}$ are applied. For example, when the first erasing voltage $V_{ER1}$ is applied to the bit lines $BL_0, BL_1 \ldots BL_{m-1}, BL_m$, the common source line CSL may be in a floating state. As another example, when the second erasing voltage $V_{ER2}$ is applied to the common source line CSL, the bit lines $BL_0, BL_1 \ldots BL_{m-1}, BL_m$ may be in a floating state. In example embodiments, however, a band-to-band tunneling efficiency may be reduced, and thus, the erasing speed of the memory transistors $T_M$ may be lower compared to when both the first erasing voltage $V_{ER1}$ and the second erasing voltage $V_{ER2}$ are applied.

In addition, example embodiments may be modified so that the first pass voltage $V_{PS1}$ and/or the second pass voltage $V_{PS2}$ are omitted because band-to-band tunneling may be induced in the channels of the string selection transistor $T_{SS}$ and the ground selection transistor $T_{GS}$ by another method, e.g., by sufficiently increasing the first erasing voltage $V_{ER1}$ and the second erasing voltage $V_{ER2}$ or decreasing a channel width of the string selection transistor TSS and the ground selection transistor TGS.

Figure 2:
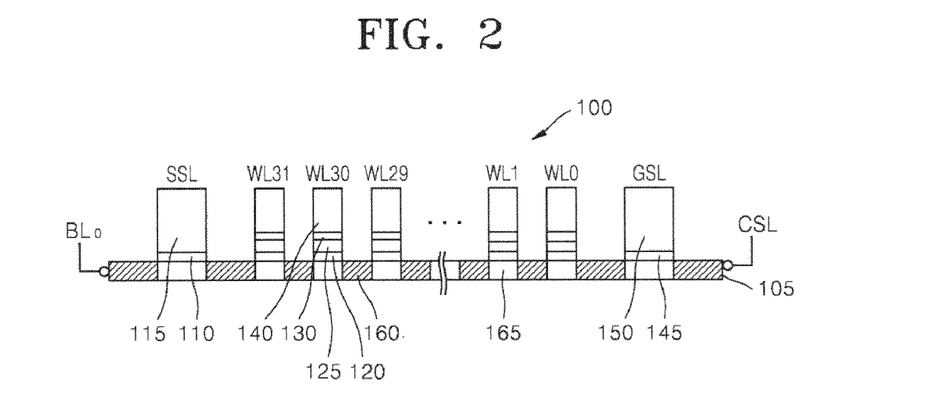
FIG. 2 is a sectional view illustrating an example structure of a nonvolatile memory device according to example embodiments.

FIG. 2 is a sectional view illustrating an example structure of a nonvolatile memory device 100 according to example embodiments. The bit line $BL_0$ of the nonvolatile memory device 100 of FIG. 1 is illustrated in FIG. 2.

Referring to FIG. 2, a semiconductor layer 105 may be provided. The semiconductor layer 105 may be formed (or otherwise disposed) in or on a bulk substrate (not shown). For example, the semiconductor layer 105 may have a semiconductor thin film or a nanowire structure. In example embodiments, the semiconductor layer 105 may have a multi-layered structure. The semiconductor layer 105 may include channel regions 165 and source and drain regions 160.

A plurality of control gate electrodes 140 may be disposed on the channel regions 165. The control gate electrodes 140 may correspond to the control gates CG of FIG. 1 and may constitute parts of the word lines WL0, WL1 . . . WL29, WL30, WL31 of FIG. 1. Tunneling insulating layers 120, charge storage layers 125, and/or blocking insulating layers 130 may be sequentially interposed between the channel regions 165 and the control gate electrodes 140. The charge storage layers 125 may correspond to the storage nodes SN of FIG. 1.

A first gate electrode 115 may correspond to the first gate G1 of FIG. 1 and may constitute a part of the string selection line SSL of FIG. 1. A first gate insulating layer 110 may be interposed between the first gate electrode 115 and a channel region 165. A second gate electrode 150 may correspond to the second gate G2 of FIG. 1 and may constitute a part of the ground selection line GSL of FIG. 1. A second gate insulating layer 145 may be interposed between the second gate electrode 150 and a channel region 165.

The source and drain regions 160 may be defined by doping impurities in portions of the semiconductor layer 105 between the first gate electrode 115, the control gate electrodes 140, and the second gate electrode 150. The bit line $BL_0$ may be connected to an end of the semiconductor layer 105, e.g., the source and drain region 160 of a string selection transistor (see $T_{SS}$ of FIG. 1). A common source line CSL may be connected to the other end of the semiconductor layer 105, e.g., the source and drain region 160 of a ground selection transistor (see $T_{GS}$ of FIG. 1).

Referring to FIG. 2, together with FIG. 1, when the first erasing voltage $V_{ER1}$ is applied to the bit line $BL_0$ and the second erasing voltage $V_{ER2}$ is applied to the common source line CSL, a strong reverse bias may be applied at the channel regions 165. Thus, junction breakdown may occur between the channel regions 165 and the source and drain regions 160, thus generating band-to-band tunneling. Therefore, holes may be injected into the channel regions 165, and thus, a sufficiently high voltage may be applied to the channel regions 165, thereby removing charges from the charge storage layers 125.

Alternatively, the source and drain regions 160 of the memory transistors $T_M$ may be defined in the semiconductor layer 105 by an electric field effect, not by impurity doping. For example, the source and drain regions 160 may be defined by a side-fringing field of the first gate electrode 115, the control gate electrodes 140, and the second gate electrode 150. In example embodiments, before applying the first erasing voltage $V_{ER1}$ and/or the second erasing voltage $V_{ER2}$, a third pass voltage may be applied to the control gate electrodes 140 or the word lines WL0, WL1 . . . WL29, WL30, WL31. Thus, before an erasing operation is performed, the source and drain regions 160 may be formed by a fringing field, and the channel regions 165 may be turned on. After that, the erasing operation may be performed.

Figure 3:
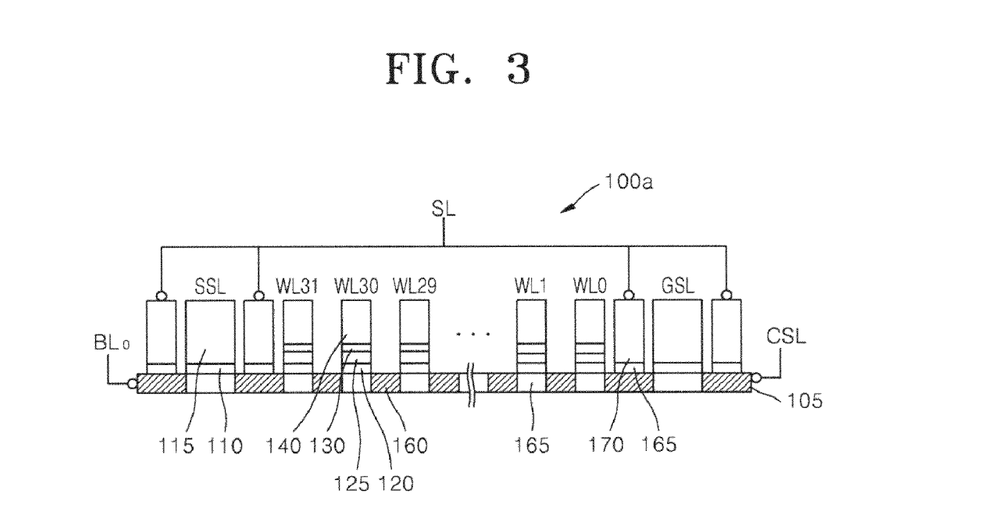
FIG. 3 is a sectional view illustrating another example structure of a nonvolatile memory device according to example embodiments.

FIG. 3 is a sectional view illustrating a structure of a nonvolatile memory device 100a according to example embodiments. The nonvolatile memory device 100a may be manufactured by adding some constituents to the nonvolatile memory device 100 of FIG. 2. Thus, portions of the description which overlap with example embodiment of FIG. 2 will be omitted.

Referring to FIG. 3, auxiliary gate electrodes 175 may be disposed on source and drain regions 160 at both sides of a first gate electrode 115 and/or source and drain regions 160 at both sides of a second gate electrode 150. Auxiliary gate insulating layers 170 may be interposed between the source and drain regions 160 and the auxiliary gate electrodes 175. The auxiliary gate electrodes 175 and the auxiliary gate insulating layers 170 may form auxiliary transistors. The auxiliary transistors may be coupled to sources or drains between a string selection transistor (see $T_{SS}$ of FIG. 1) and memory transistors (see $T_M$ of FIG. 1) and/or between a ground selection transistor (see $T_{GS}$ of FIG. 1) and the memory transistors $T_M$.

The auxiliary gate electrodes 175 may be commonly connected to an auxiliary line SL. During an erasing operation of the nonvolatile memory device 100a, a fourth pass voltage may be applied to the auxiliary line SL. The fourth pass voltage may assist in facilitating band-to-band tunneling in the string selection transistor $T_{SS}$ and the ground selection transistor $T_{GS}$. Therefore, the erasing speed of the nonvolatile memory device 100a may be increased.

Figure 4:
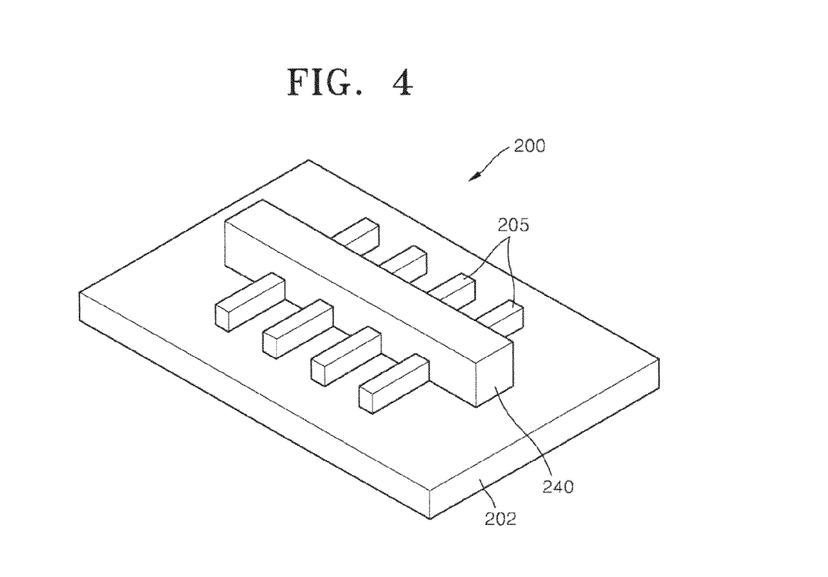
FIG. 4 is a perspective view illustrating an example structure of a nonvolatile memory device according to example embodiments.

FIG. 4 is a perspective view illustrating a structure of a nonvolatile memory device 200 according to example embodiments. The nonvolatile memory device 200 may correspond to some of the memory transistors of the nonvolatile memory device 100 of FIG. 1.

Referring to FIG. 4, a plurality of nanowires 205 may be disposed on an insulating layer 202. The nanowires 205 may correspond to the semiconductor layer 105 of FIG. 2. A control gate electrode 240 may be disposed on the insulating layer 202 to cover a plurality of surfaces of the nanowires 205. For example, the control gate electrode 240 may surround three surfaces or all the surfaces of each of the nanowires 205.

Such a structure may decreases area of memory transistors, thereby contributing to the higher integration of the nonvolatile memory device 200. Moreover, an effective channel length may be increased, effectively reducing or preventing a short channel effect.

The erasing operations of FIGS. 1 through 3 may be applied to the nonvolatile memory device 200. That is, a body bias need not be applied to the nonvolatile memory device 200, but a data erasing operation may be performed using the erasing operation of FIGS. 1, 2, or 3. Furthermore, the nonvolatile memory device 200 may be more highly integrated using a multi-stack structure, and data may be more reliably erased with no body bias using the erasing operation of FIGS. 1, 2, or 3.

Figure 5:
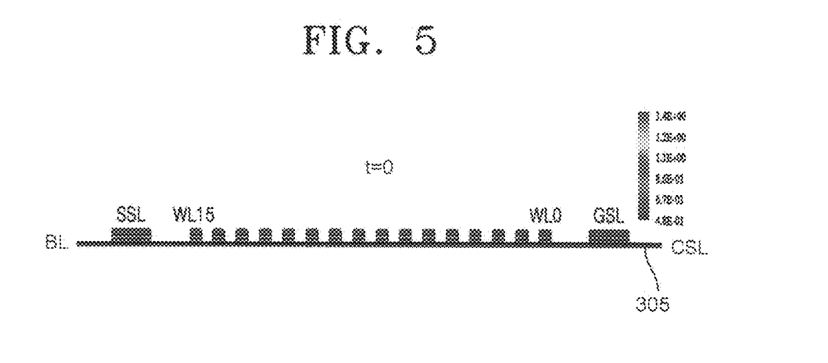
FIGS. 5 through 7 are sectional views showing simulation results for the voltage distribution of a nonvolatile memory device according to example embodiments.
Figure 6:
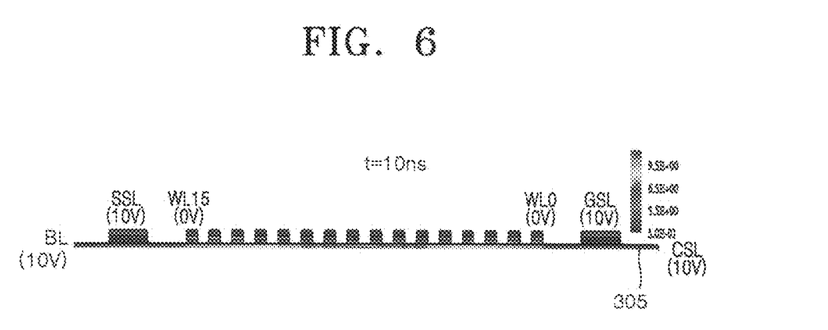
Figure 7:
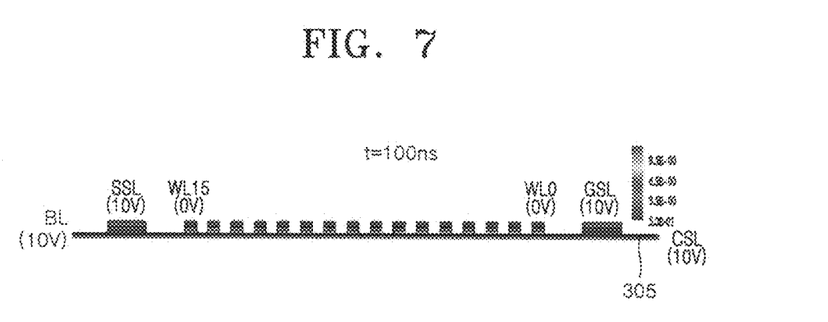

FIGS. 5 through 7 are sectional views showing simulation results for the voltage distribution of a nonvolatile memory device according to example embodiments. In this experimental example, a charge concentration (counts/cm$^3$) increases.

Referring to FIG. 5, word lines WL0 . . . WL15 may be disposed on a semiconductor layer 305. The number of the word lines WL0 . . . WL15 was optionally selected for convenience of simulations. Thus, the nonvolatile memory device of this experimental example may correspond to a device obtained by reducing the number of the memory transistors from the nonvolatile memory device 100 of FIG. 1. Before an erasing operation (erasing time (t)=0 ns), memory transistors may be programmed to store data, and the semiconductor layer 305 may be almost 0 V.

Referring to FIG. 6, an erasing voltage of about 10 V was applied to a bit line BL, a common source line CSL, a string selection line SSL, and a ground selection line GSL, and 0 V was applied to the word lines WL0 . . . WL15. After an erasing time (t) of 10 ns, a voltage was propagated from both ends of the semiconductor layer 305 to the middle. That is, a voltage increases from the bit line BL and the common source line CSL to the middle.

Referring to FIG. 7, after an erasing time (t) of 100 ns, the semiconductor layer 305 wholly reached about 10V. This shows that holes were injected into the memory transistors through band-to-band tunneling.

The simulation results of FIGS. 5 through 7 show that the erasing operation of FIG. 1 may be efficiently performed. That is, an erasing voltage may be supplied to the semiconductor layer 305 by applying the erasing voltage to the bit line BL and the common source line CSL.

FIGS. 8 through 11 are sectional views showing simulation results for another erasing operation of a nonvolatile memory device according to example embodiments. In this experimental example, a charge concentration (counts/cm$^3$) decreases.

Figure 8:
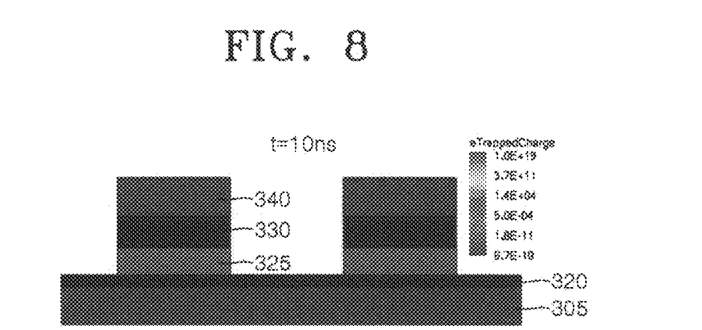
FIGS. 8 through 11 are sectional views showing simulation results for an erasing operation of a nonvolatile memory device according to example embodiments.

Referring to FIG. 8, a control gate electrode 340 may be provided on a semiconductor layer 305. A blocking insulating layer 330, a charge storage layer 325, and a tunneling insulating layer 320 may be disposed between the control gate electrode 340 and the semiconductor layer 305. In this experimental example, the charge storage layer 325 served as a trapping layer, and an erasing voltage of about 20 V was applied to a bit line and a common source line.

After an erasing time (t) of 10 ns, a charge concentration of the charge storage layer 325 was not significantly changed. This shows that the propagation of the erasing voltage may be not sufficient.

Figure 9:
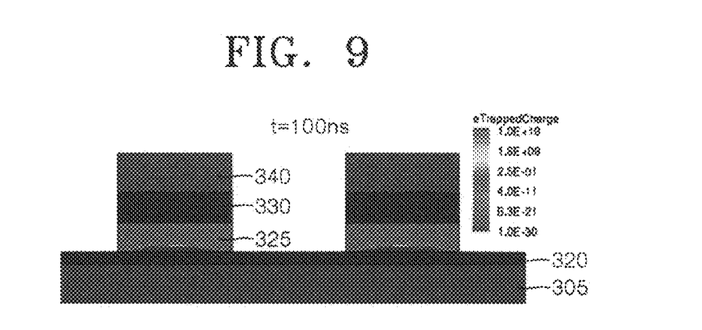

Referring to FIG. 9, after an erasing time (t) of 100 ns, a charge concentration was lowered at a bottom portion of the charge storage layer 325. This shows that charges started to be removed from the charge storage layer 325.

Figure 10:
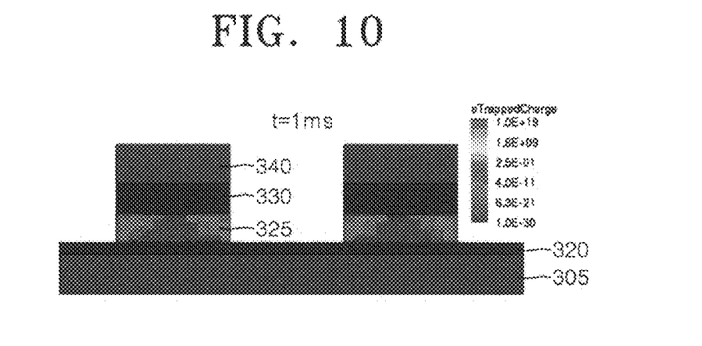

Referring to FIG. 10, after an erasing time (t) of 1 ms, a charge concentration was lowered at considerable portions of the charge storage layer 325. This shows that a significant amount of charges were removed from the charge storage layer 325.

Figure 11:
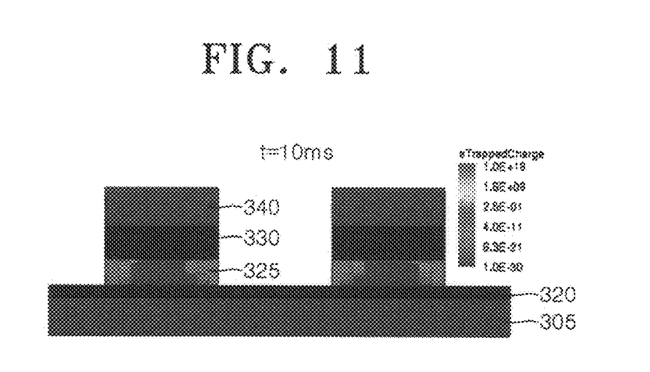

Referring to FIG. 11, after an erasing time (t) of 10 ms, a charge concentration was lowered at most of the charge storage layer 325. Thus, most charges were removed from the charge storage layer 325.

The results of FIGS. 8 through 11 show that an erasing operation may be performed by applying an erasing voltage to a bit line and a common source line. Meanwhile, the charge storage layer 325 may also be formed as a floating gate, not as a trapping layer. In this case, an erasing speed may be further increased.

Figure 12:
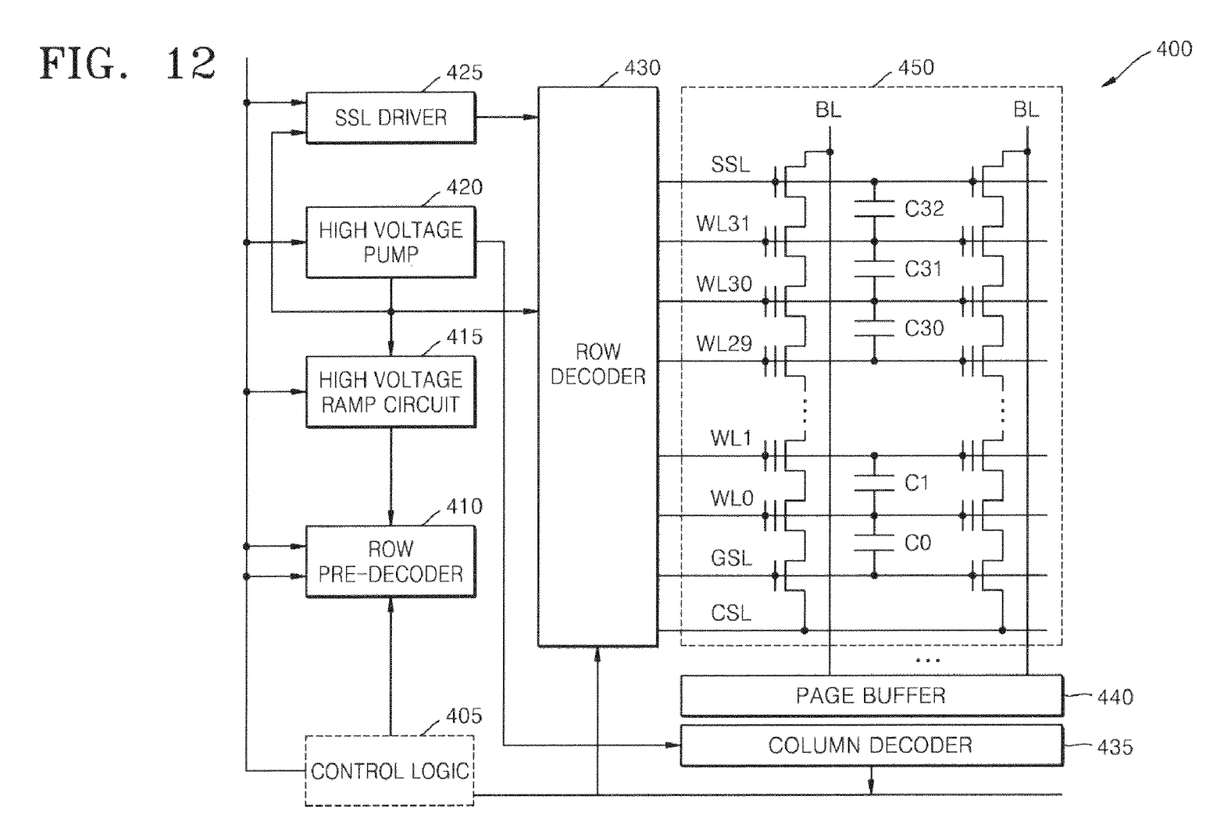
FIG. 12 is a block diagram illustrating a nonvolatile memory device according to example embodiments.

FIG. 12 is a block diagram illustrating a nonvolatile memory device 400 according to example embodiments.

Referring to FIG. 12, a NAND cell array 450 may correspond to the nonvolatile memory device 100 of FIG. 1. A string selection line SSL, word lines WL0, WL1 . . . WL29, WL30, WL31, a ground selection line GSL, and a common source line CSL of the NAND cell array 450 may be connected to a row decoder 430. Bit lines BL of the NAND cell array 450 may be connected to a page buffer 440 and a column decoder 435.

The row decoder 430 may receive signals through a SSL driver 425, a high voltage pump 420, a high voltage ramp circuit 415, and a row pre-decoder 410. Thus, during an erasing operation, a high erasing voltage may be supplied to the common source line CSL from the high voltage pump 420 via the row decoder 430. A control logic 405 may optionally control the SSL driver 425, the high voltage pump 420, the high voltage ramp circuit 415, and the row pre-decoder 410.

Unlike a conventional nonvolatile memory device, in example embodiments, the high voltage pump 420 may be further connected to the column decoder 435. Thus, during an erasing operation, a high erasing voltage may be supplied to the bit lines BL from the high voltage pump 420 via the column decoder 435. Therefore, the nonvolatile memory device 400 may not require an additional high voltage generator.

While example embodiments have been particularly shown and described with reference to FIGS. 1-12, it will be understood by those of ordinary skill in the art that various changes in form and details may be made therein without departing from the spirit and scope of example embodiments as defined by the following claims.

In a method of operating a nonvolatile memory device according to example embodiments, an erasing operation may be reliably performed without applying a body bias. This operation method may be efficiently applied to a three-dimensional nonvolatile memory device to which a body bias may not be applied. Such a three-dimensional nonvolatile memory device may be suitable for high integration and preventing a short channel effect.

Moreover, a data erasing operation may be performed even without applying a high voltage to a control gate. Thus, during a programming operation and an erasing operation, application of high voltages of opposite polarities to a control gate may be avoided, thereby enhancing the reliability of memory transistors.

In addition, a high erasing voltage may be supplied to a row decoder and a column decoder using a single high voltage pump. Therefore, there may be no need to use an additional high voltage generator.

What is claimed is:

1. A method of operating a nonvolatile memory device comprising:
    applying an erasing voltage to at least one of a bit line and a common source line, with a plurality of memory transistors being between the bit line and the common source line; and
    injecting holes into channels of the memory transistors through band-to-band tunneling due to the erasing voltage, thereby raising a channel voltage of the memory transistors.

2. The method of claim 1, wherein in the applying the erasing voltage, a first erasing voltage is applied to the plurality of bit lines and a second erasing voltage is applied to the common source line.

3. The method of claim 2, wherein the channels of the memory transistors are charged with a balance voltage between the first erasing voltage and the second erasing voltage.

4. The method of claim 2, wherein the first erasing voltage and the second erasing voltage are the same.

5. The method of claim 2, wherein the first erasing voltage is supplied from a high voltage pump via a row decoder, and the second erasing voltage is supplied from the high voltage pump via a column decoder.

6. The method of claim 1, wherein in the applying the erasing voltage, a pass voltage is applied to at least one of the string selection line and the ground selection line of the NAND cell array.

7. The method of claim 6, wherein a first pass voltage is applied to the string selection line and a second pass voltage is applied to the ground selection line.

8. The method of claim 1, wherein a reverse bias is applied at channels of the memory transistors during the step of applying the erasing voltage.

9. The method of claim 8, wherein the channel voltage of the memory transistors is raised by junction breakdown between the channels and source and drain regions.

10. The method of claim 8, the reverse bias is applied without directly applying an erasing voltage to the channels of the memory transistors.

11. A method of operating a nonvolatile memory device comprising:
    applying a first erasing voltage to a bit line and a second erasing voltage to a common source line, with a plurality of memory transistors being between the bit line and the common source line; and
    injecting holes into channels of the memory transistors through band-to-band tunneling due to the first and second erasing voltages, thereby charging channels of the memory transistors with a balance voltage between the first erasing voltage and the second erasing voltage.

12. The method of claim 11, wherein the first erasing voltage and the second erasing voltage are the same.

13. The method of claim 11, wherein the first erasing voltage is supplied from a high voltage pump via a row decoder, and the second erasing voltage is supplied from the high voltage pump via a column decoder.

14. The method of claim 11, wherein in the applying the erasing voltage, a pass voltage is applied to at least one of the string selection line and the ground selection line of the NAND cell array.

15. The method of claim 14, wherein a first pass voltage is applied to the string selection line and a second pass voltage is applied to the ground selection line.

16. The method of claim 11, wherein a reverse bias is applied at channels of the memory transistors during the step of applying the erasing voltage.

17. The method of claim 16, wherein the channel voltage of the memory transistors is raised by junction breakdown between the channels and source and drain regions.

18. The method of claim 16, the reverse bias is applied without directly applying an erasing voltage to the channels of the memory transistors.

19. A nonvolatile memory device comprising:
    a plurality of memory transistors;
    a bit line; and
    a common source line, the plurality of memory transistors being between the bit line and the common source line, with an erasing voltage being applied to at least one of the bit line and the common source line, wherein
    holes are injected into channels of the memory transistors through band-to-band tunneling due to the erasing voltage, thereby raising a channel voltage of the memory transistors to erase data from the memory transistors.

20. The device of claim 19, wherein a string selection transistor and a ground selection transistor are between the bit line and the common source line.

21. The method of claim 1, further comprising:
    moving electrons from charge storage layers of the memory transistors to the channels of the memory transistors based on the holes injected into the channel layer.

22. The method of claim 11, further comprising:
    moving electrons from charge storage layers of the memory transistors to the channels of the memory transistors based on the holes injected into the channel layer.

23. The device of claim 19, wherein
    holes are injected into channels of the memory transistors in such a manner that that electrons move from charge storage layers of the memory transistors to the channels of the memory transistors based on the holes injected into the channel layer.

* * * * *